United States Patent
Haiberger et al.

(10) Patent No.: US 11,417,639 B2
(45) Date of Patent: Aug. 16, 2022

(54) OPTOELECTRONIC DEVICE WITH AN ACTIVE ELEMENT

(71) Applicant: OSRAM OLED GmbH, Regensburg (DE)

(72) Inventors: Luca Haiberger, Regensburg (DE); Matthias Sperl, Mintraching (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/650,316

(22) PCT Filed: Oct. 9, 2018

(86) PCT No.: PCT/EP2018/077435
§ 371 (c)(1),
(2) Date: Mar. 24, 2020

(87) PCT Pub. No.: WO2019/076679
PCT Pub. Date: Apr. 25, 2019

(65) Prior Publication Data
US 2020/0266179 A1    Aug. 20, 2020

(30) Foreign Application Priority Data
Oct. 19, 2017   (DE) .................... 10 2017 124 455.7

(51) Int. Cl.
*H01L 25/16* (2006.01)
*H01L 31/153* (2006.01)
*H01L 33/64* (2010.01)

(52) U.S. Cl.
CPC .......... *H01L 25/167* (2013.01); *H01L 31/153* (2013.01); *H01L 33/645* (2013.01)

(58) Field of Classification Search
CPC ... H01L 25/167; H01L 31/153; H01L 33/645; H01L 25/13; H01L 25/0753; H01L 33/486; H01L 33/60
See application file for complete search history.

(56) References Cited

U.S. PATENT DOCUMENTS 9,054,279 B2 * 6/2015 Bogner ................. H01L 25/167
9,865,661 B2 * 1/2018 Sato .................... H01L 27/3246
(Continued)

FOREIGN PATENT DOCUMENTS

DE          19932051 A1     1/2001
DE       102009003936 A1    7/2010
(Continued)

OTHER PUBLICATIONS

Samsung Galaxy S6 Specs, https://www.samsungsfour.com/specifications/samsung-galaxy-s6-full-phone-specifications.html (Year: 2015).*

(Continued)

*Primary Examiner* — Matthew L Reames
(74) *Attorney, Agent, or Firm* — ArentFox Schiff LLP (57) ABSTRACT

An optoelectronic device is specified, with
a radiation-emitting semiconductor chip configured to generate electromagnetic radiation, and
an active element configured to change a physical state, wherein
the active element is embedded in a component of the component, and
the physical change of state comprises the following: temperature change, sound generation, mechanical motion.

17 Claims, 4 Drawing Sheets

(56) References Cited

U.S. PATENT DOCUMENTS

| | | | |
|---|---|---|---|
| 2010/0270567 A1* | 10/2010 | Emerson | H05B 31/50 257/89 |
| 2011/0068697 A1* | 3/2011 | Hum | H01L 25/0753 315/152 |
| 2011/0084612 A1 | 4/2011 | Ratcliffe et al. | |
| 2012/0074301 A1* | 3/2012 | Kroese | H01L 25/167 250/226 |
| 2012/0211766 A1 | 8/2012 | Komoto et al. | |
| 2017/0040306 A1 | 2/2017 | Kim et al. | |
| 2018/0275757 A1* | 9/2018 | Cruz-Hernandez | H01L 27/323 |

FOREIGN PATENT DOCUMENTS

| | | | |
|---|---|---|---|
| DE | 102012103161 A1 | 10/2013 | |
| JP | 2003216052 A | 7/2003 | |
| WO | 2012042100 A1 | 4/2012 | |

OTHER PUBLICATIONS

David Williams turn off Haptic Feedback on Samsung Galaxy S6 (solution) https://www.techjunkie.com/turn-off-haptic-feedback-on-samsung-galaxy-s6-solution/print/ (Year: 2016).*

International Search Report issued in corresponding International Application No. PCT/EP2018/077435 dated Dec. 14, 2018.

"LED traffic lights pose unexpected hazard" http://asia.nikkei.com/Japan-Update/LED-traffic-lights-pose-unexpected-hazard; Nikkei Asian Review; Feb. 22, 2015; 4 pages.

* cited by examiner

OPTOELECTRONIC DEVICE WITH AN ACTIVE ELEMENT

CROSS-REFERENCE TO RELATED APPLICATIONS

This application is a 35 U.S.C. § 371 National Phase of PCT Application No. PCT/EP2018/077435, filed Oct. 9, 2018, which claims priority to German Application No. 10 2017 124 455.7, filed Oct. 19, 2017, the disclosures of which are hereby incorporated by reference herein.

BACKGROUND

An optoelectronic device is specified. An object to be solved is to specify an optoelectronic device, which is particularly space-saving.

SUMMARY

An optoelectronic device is specified. The optoelectronic device is, for example, a radiation-emitting device that emits electromagnetic radiation, in particular visible light, during operation. For example, the component is a light-emitting diode.

According to at least one embodiment, the optoelectronic device comprises one or more radiation-emitting semiconductor chips. The at least one radiation-emitting semiconductor chip is configured to generate electromagnetic radiation, in particular to generate visible light. The at least one radiation-emitting semiconductor chip is preferably a light-emitting diode chip, in short LED chip or laser diode chip. The at least one radiation-emitting semiconductor chip can have several image points or pixels or be one-channel. The at least one radiation-emitting semiconductor chip can, for example, emit white light during operation.

If the optoelectronic device comprises several semiconductor chips, these can be configured to generate light of different wavelengths, in particular different colours.

According to at least one embodiment, the optoelectronic device comprises one or more active elements configured to change a physical state. Here, the at least one active element is configured to convert an electrical signal into a physical quantity, for example. The physical quantity indicates the state of a physical system, which in this case is the state of the at least one active element. The electrical signal, for example, is configured to be changeable and can lead to a change of the physical quantity and thus to a physical change of state. This is to say that the change of the electrical signal leads to a physical change of state of the at least one active element.

The at least one active element is preferably arranged in a common plane with the at least one radiation-emitting semiconductor chip. The at least one active element preferably does not overlap with the radiation-emitting semiconductor chip in plan view of the optoelectronic device. If, for example, the optoelectronic device has a plurality of active elements, each of the active elements of the plurality of active elements is laterally spaced apart from the at least one semiconductor chip.

According to at least exemplary embodiment, the at least one active element is embedded in a component of the optoelectronic device. In this context, "embedded" can mean that the at least one active element rests on the component, lies partially inside the component and/or is enclosed by the component on at least part of its outer surface. Here, the at least one active element can be in direct contact with the component. The component can be configured electrically active or passive or insulating, for example. This is to say that in addition to embedding the at least one active element, the component also takes over other functions, in particular electrical functions.

According to at least one embodiment, the physical change of state of the at least one active element comprises, for example, a change of temperature, sound generation and/or mechanical movement. The temperature change can be achieved, for example, by a Peltier element. The corresponding active element is then configured to heat or cool the optoelectronic device. The sound generation can be achieved, for example, by an ultrasonic emitter or a loudspeaker. The corresponding active element is then configured to generate tones and vibrations, for example. The mechanical movement can be achieved, for example, by piezo actuators or eccentric motors. The corresponding active element is then configured to generate vibrations, for example.

The at least one active element is mechanically coupled to the component by being embedding in the component. This makes it possible that the change of state is at least partially transferred to the component. If the change of state is, for example, a change of temperature, the temperature change is also at least partially transferred to the component due to the embedding.

In at least one embodiment, the optoelectronic device comprises at least one radiation-emitting semiconductor chip for generating electromagnetic radiation and at least one active element configured to change a physical state. The at least one active element is embedded in a component. The physical change of state by the at least one active element can comprise a change of temperature, sound generation and/or mechanical movement.

The optoelectronic device described here makes use, inter alia, of the idea that the optoelectronic device is provided with an active element that can produce a physical change of state. Furthermore, one idea is to embed the active element in the component, wherein the change of state can be transferred to the component. This makes it advantageously possible, for example, to increase the area over which the change of state can be perceived. In this way, the physical change of state caused by the active element can be haptically very easily recognized. In addition, the entire device can be heated via the component, for example. The device can be used, for example, as a light source outdoors, for example in a traffic light or street lamp, and can be heated and, for example, de-iced using the active element. Because the active element is integrated into the optoelectronic device, the device is particularly space-saving. It is therefore conceivable that the device can be used in displays for mobile applications. Furthermore, the device can also be used for video wall displays, for example. Since the various elements, such as the active element and a radiation-emitting semiconductor chip, can be produced on a common carrier, this also results in advantageous low assembly costs, for example.

According to at least one embodiment, the optoelectronic device comprises one or more sensor elements. The at least one sensor element is configured to detect at least one of the following quantities: temperature, pressure, sound, electromagnetic radiation, electrical capacitance. The detection of the temperature is carried out by a Peltier element, for example. The detection of the sound can be carried out by a microphone, for example. The detection of electromagnetic radiation can be carried out by a semiconductor detector chip such as a photodiode chip. The detection of electrical capacitance can be carried out by a capacitor, for example.

According to at least one embodiment, the sensor element is embedded in the component of the optoelectronic device. In this context, "embedded" can mean that the at least one sensor element rests on the component, lies partially inside the component and/or is enclosed by the component on at least part of its outer surface. Here, the at least one sensor element can be in direct contact with the component. The component can be configured electrically active or passive or insulating, for example. This is to say that in addition to embedding the at least one sensor element, the component also takes over other functions, in particular electrical functions. By embedding the at least one sensor element in the component, it is possible for a signal to be received by the at least one sensor element to be conducted at least partially via the component to the at least one sensor element. In this way, for example, the touching of the component can be perceived as a signal by the at least one sensor element without the at least one sensor element has to be touched. The embedding can thus increase the signal receiving area.

According to at least one embodiment, the physical change of state by the at least one active element is haptically detectable. The optoelectronic device is intended to rest against or be close to a body part. This means in particular that a distance between the at least one active element and/or the at least one sensor element and the body part during operation of the device can be so small that the physical change of state caused by the at least one active element is haptically detectable by a user of the device. The body part is, for example, a finger of the user. In particular, the body part comprises skin. The at least one active element is configured to exert haptic stimuli on the body part in the form of pressure, vibration and/or temperature, for example. The user is thus able to perceive size, contours and/or surface textures, for example. The optical stimuli can also be transmitted in particular via the component in which the at least one active element is embedded. In this way, a particularly large surface area can be made available for the haptic perception, which simplifies the perception.

According to at least one embodiment, at least two of the following elements are arranged spaced apart from one another in a lateral direction: radiation-emitting semiconductor chip, active element and/or sensor element. The optoelectronic device has a main plane of extension. The lateral directions are aligned parallel to the main plane of extension. For example, the at least one radiation-emitting semiconductor chip is spaced apart in lateral directions from the at least one active element and/or the at least one sensor element. Here, the radiation-emitting semiconductor chips can be spaced apart from one another in lateral directions. The active elements and/or the sensor elements can also be arranged spaced apart from one another in lateral directions.

According to at least one embodiment, the component of the optoelectronic device is formed by at least one of the following constituents: cover body, reflector element, carrier. The cover body is transmissive, for example transparent, or opaque to the radiation emitted by the at least one radiation-emitting semiconductor chip. The cover body can be reflective, in particular diffusely reflective, or absorbent. The cover body is formed in particular from a plastic material such as a silicone, an epoxy or an epoxy hybrid material. A colouring agent such as carbon black or a pigment may be added to the plastics material. Thus, the cover body can appear black or white or coloured. A cover body formed from a plastics material can be particularly well suited to transmit sound and/or other mechanical movements to the cover body from the at least one active element and/or to the at least one sensor element.

Further materials—for example metal particles—can be added to the cover body, which increase the thermal conductivity of the cover body. In this way, the cover body can also be configured particularly well for thermal coupling of the at least one active element and/or the at least one sensor element.

The reflector element is configured to reflect electromagnetic radiation generated during operation by the at least one radiation-emitting semiconductor chip. The reflector element can, for example, be formed by a plastics material filled with radiation-scattering and/or radiation-reflecting particles. Furthermore, the reflector element can contain at least one layer of a metallic material.

The carrier can be a permanent carrier of the optoelectronic device, which is the mechanically supporting component of the device. The further components of the device can, for example, be permanently connected directly or indirectly to the carrier. The carrier can be made of an electrically insulating base material such as a glass or a ceramic or a plastics material. It is also possible that the carrier consists of or contains a semiconductor material.

According to at least one embodiment, the at least one active element and the at least one radiation-emitting semiconductor chip are embedded in the cover body. By embedding the at least one active element in the cover body, for example, the physical change of state caused by the at least one active element can be transferred to the cover body. If the at least one active element is, for example, configured to generate vibrations and/or temperature changes, the vibration and/or the temperature change can be transmitted to the cover body, in particular a top surface of the cover body. The top surface of the cover body is located on an emission side of the at least one optoelectronic semiconductor chip. The top surface of the cover body is large compared to an outer surface of the at least one active element. This means that the at least one active element transmits the generated stimulus to a larger surface so that the stimulus can be better perceived by the user.

According to at least one embodiment, the at least one sensor element is embedded in the cover body. The cover body mechanically connects at least two of the following elements with one another: semiconductor chip, active element, sensor element. It is possible that the composite between the cover body and the other elements is mechanically self-supporting. The cover body can thus represent the mechanically stabilizing and supporting component of the optoelectronic device. In this case, it is possible that the device is free of a further carrier.

For example, a bottom side and an upper side of the cover body are aligned at least in places parallel to the main plane of extension of the optoelectronic device and can, for example, terminate flush with the at least one radiation-emitting semiconductor chip. The upper side is located on the emission side and the bottom side is the side facing away from the emission side. The at least one radiation-emitting semiconductor chip and the at least one active element and/or the at least one sensor element, if present, can be contacted, for example, on the bottom side, as contact points are exposed there.

According to an embodiment, the cover body terminates flush with the at least one active element and/or the at least one sensor element in a vertical direction or the cover body projects beyond it. Here the vertical direction is perpendicular to the main plane of extension of the optoelectronic device. If the cover body projects beyond the at least one active element and/or the at least one sensor element, the top surface of the cover body is arranged above the top surface of the at least one active element and/or a top surface of the at least one sensor element in a vertical direction on the emission side. If the at least one active element is configured to generate, for example, vibrations and/or temperature changes, the vibration and/or the temperature change can be transmitted to the cover body, in particular the top surface of the cover body. In order to perceive the stimulus of the at least one active element with the body part, no direct contact with the at least one active element is therefore necessary. If, for example, pressure is exerted by the body part on the optoelectronic device, a signal can be detected by the at least one sensor element. The body part does not necessarily have to be in contact with the at least one sensor element. In this case the cover body represents a protective layer for the at least one active element and/or the at least one sensor element.

According to at least one embodiment, the at least one active element is embedded in a reflector element which laterally surrounds the at least one radiation-emitting semiconductor chip at least in places in lateral directions. The reflector element comprises, for example, a reflector wall which is inclined away from the at least one optoelectronic semiconductor chip and runs obliquely to the main plane of extension of the device.

The inner surface of the reflector wall facing the at least one radiation-emitting semiconductor chip is configured to reflect the electromagnetic radiation emitted by the radiation-emitting semiconductor chip. The at least one active element is arranged, for example, on the outer surface of the reflector element facing away from the at least one radiation-emitting semiconductor chip. This is to say, for example, that the reflector element is arranged at least in places in lateral directions between the radiation-emitting semiconductor chip and the at least one active element. The at least one active element can terminate flush with the reflector element in vertical direction. The embedding in the reflector element prevents the emitted light from at least one radiation-emitting semiconductor chip from impinging on the at least one active element and thus being absorbed. The reflector element thus causes an increased light extraction.

According to at least one embodiment, the at least one sensor element is embedded in the reflector element, which laterally surrounds the radiation-emitting semiconductor chip at least in places in lateral directions. The at least one sensor element is arranged, for example, on the outer surface of the reflector element facing away from the at least one radiation-emitting semiconductor chip. This is to say, for example, that the reflector element is arranged at least in places in lateral directions between the radiation-emitting semiconductor chip and the at least one sensor element. The at least one sensor element can terminate flush with the reflector element in the vertical direction. Embedding in the reflector element prevents the emitted light from at least one radiation-emitting semiconductor chip from impinging on the at least one sensor element and thus being absorbed. Thus the reflector element causes an increased light extraction.

According to at least one embodiment, the optoelectronic device comprises a carrier, wherein at least one of the following elements is attached to the carrier and/or embedded in the carrier: radiation-emitting semiconductor chip, active element, sensor element. The carrier can, for example, be based on a semiconductor material and form, for example, a unit for driving and/or reading the signals of the elements. The carrier preferably comprises several electrical vias formed in or on the base material or semiconductor material.

According to at least one embodiment, the carrier comprises an integrated circuit. The integrated circuit is formed, for example, by an application-specific integrated circuit, or ASIC for short.

According to at least one embodiment, the integrated circuit is configured to electrically connect at least two of the following elements to one another and/or to control at least one of the following elements: radiation-emitting semiconductor chip, active element, sensor element. For this purpose, all electrical contact surfaces of the optoelectronic device are located on the bottom side, which is arranged on the side facing away from the emission side. This is to say that the elements of the optoelectronic device, which are arranged on the integrated circuit, can be electrically and preferably also mechanically connectable via the integrated circuit, for example, and are thus electrically connected to one another. Here, the integrated circuit comprises for example a control unit, an evaluation unit and/or a driving unit. The control unit and the evaluation unit each read and check the state of the at least one light-emitting semiconductor chip, the at least one active element and/or the at least one sensor element. The driving unit can, for example, control the state of the at least one light-emitting semiconductor chip, the at least one active element and/or the at least one sensor element and, for example, switch the respective elements on or off.

Alternatively, it is possible that such a unit for controlling, evaluating and/or driving the elements is located outside the optoelectronic device and that the optoelectronic device is, for example, electrically connected to such a unit or is applied to such a unit, for example soldered.

A display device is further specified. The display device comprises at least two of the optoelectronic devices described herein. This is to say that all features disclosed for the optoelectronic device are also disclosed for the display device and vice versa.

According to at least one embodiment, a plurality of optoelectronic devices form a display device which is configured to display images or video sequences. This means that, for example, a display is generated by a plurality of optoelectronic devices. The optoelectronic devices are arranged next to one another in lateral directions. The arrangement of the optoelectronic devices is preferably matrix-like, i.e. arranged in columns and rows, wherein a limiting element is arranged between adjacent optoelectronic devices. The optoelectronic devices can, for example, be formed by cover bodies with embedded elements. The limiting element is a second cover body in which the cover bodies with embedded elements are embedded.

Alternatively, the limiting element can be formed by the reflector element which laterally surrounds the radiation-emitting semiconductor chip at least in places in lateral directions and which is designed to reflect electromagnetic radiation generated by the radiation-emitting semiconductor chip during operation. The at least one active element and/or the at least one sensor element is embedded in the reflector elements between the adjacent components.

In the following, an optoelectronic device described here is explained in more detail with reference to the Figures using exemplary embodiments.

DETAILED DESCRIPTION

Identical, similar or similarly acting elements are marked with the same reference signs in the Figures. The Figures and the proportions of the elements shown in the Figures to one another are not to be regarded as true to scale. Rather, individual elements can be oversized for better representability and/or comprehensibility.

Figure 1A:
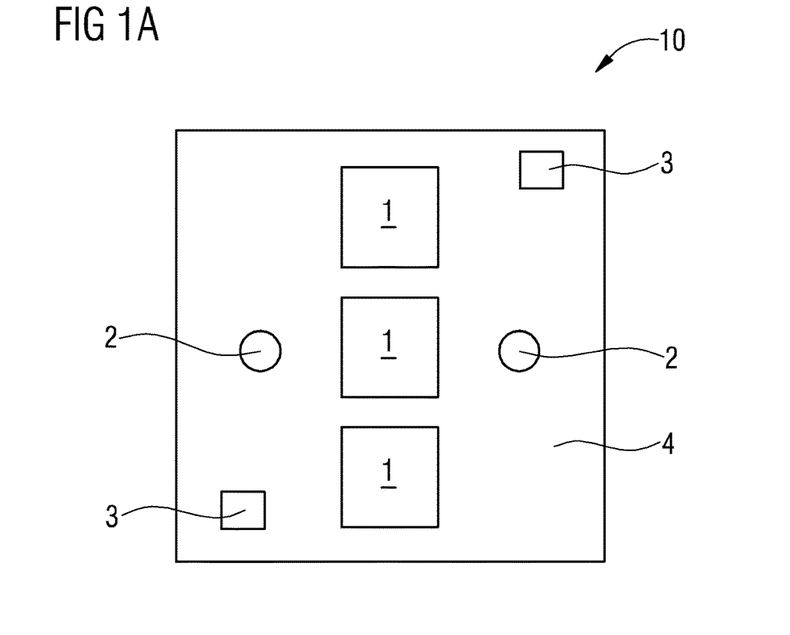
FIGS. 1A, 1B and 1C show a schematic top view and schematic sectional views of an exemplary embodiment of an optoelectronic device described here.
Figure 1B:
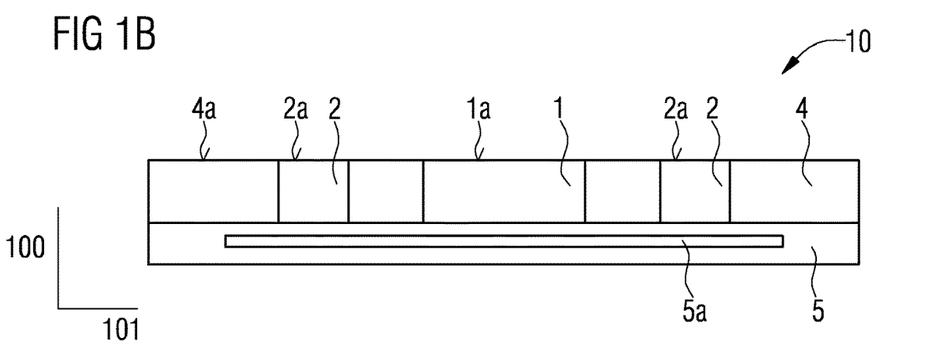
Figure 1C:
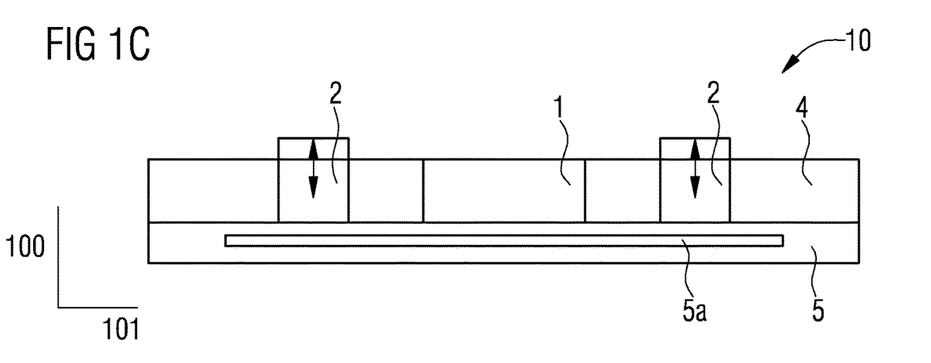

FIGS. 1A, 1B and 1C show an exemplary embodiment of an optoelectronic device 10, wherein the top view is shown in FIG. 1A and the sectional views in FIGS. 1B and 1C.

The optoelectronic device 10 shown in FIG. 1A comprises at least one radiation-emitting semiconductor chip 1 configured to generate radiation. It is shown that there are three radiation-emitting semiconductor chips 1 for emitting radiation of different wavelengths. The radiation-emitting semiconductor chips 1 are arranged next to one another. Deviating from this, an arrangement in a triangle is also possible, for example. Furthermore, the optoelectronic device 10 comprises one or more active elements 2 and/or one or more sensor elements 3, which are arranged spaced apart form one another in a lateral direction 101 and from the radiation-emitting semiconductor chips 1. The elements are embedded in a reflective cover body 4 which is opaque to the respective radiation.

The top surface of the cover body 4a shown in FIG. 1B terminates flush with the top surface of the active element 2a, the top surface of the sensor element 3a and the top surface of the radiation-emitting semiconductor chip 1a. The cover body 4 with the embedded elements 1, 2, 3 terminates flush with the carrier 5 on the side facing away from the emission side. The carrier 5 can comprise an integrated circuit 5a, with which the electrical contact of radiation-emitting semiconductor chip 1, active element 2 and/or sensor element 3 is established. Furthermore, the integrated circuit 5a can comprise, for example, the control unit, the evaluation unit and/or the driving unit (not shown here). With these units it is possible, for example, to read and/or drive the radiation-emitting semiconductor chip 1 and/or the at least one active element 2 and/or the at least one sensor element 3.

FIG. 1C shows the operating state in which the at least one active element 2, here for example piezo actuators, is operated. This produces the mechanical movement in the vertical direction 100, which is indicated by arrows in FIG. 1C. This mechanical movement can be transferred to the cover body 4, for example, in particular to the top surface of the cover body 4a. The top surface of the cover body 4a is located here on the emission side. The top surface of the cover body 4a forms here, for example, the area covered by the body part which is large compared to the top surface of the at least one active element 2a.

This is to say that the at least one active element transmits the generated stimulus, here for example the vibration, to a larger top surface of the cover body 4a, which can be perceived by the user through the body part. This mechanical stimulus represents the haptic stimulus that is perceived by a body part, which here, for example, is in direct contact with the top surface 1a, 2a, 3a.

Figure 2:
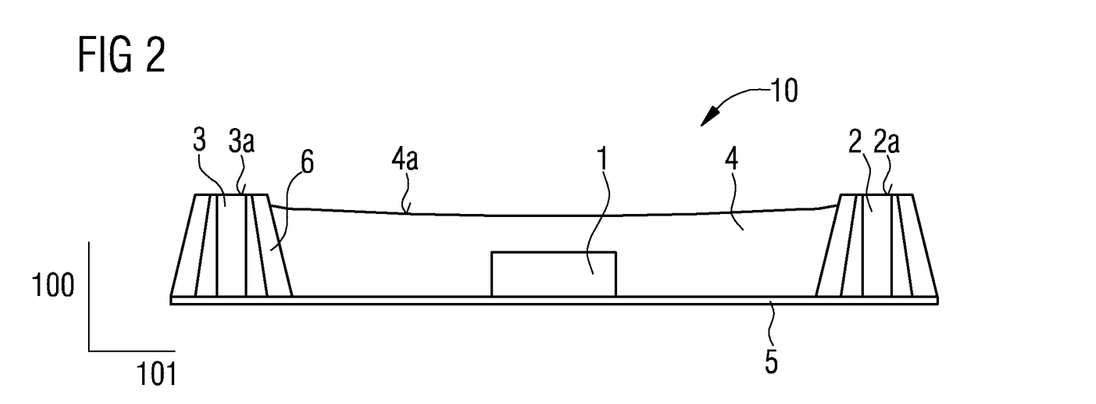
FIGS. 2 and 3 show schematic sectional views of exemplary embodiments of an optoelectronic device described here.
Figure 5:
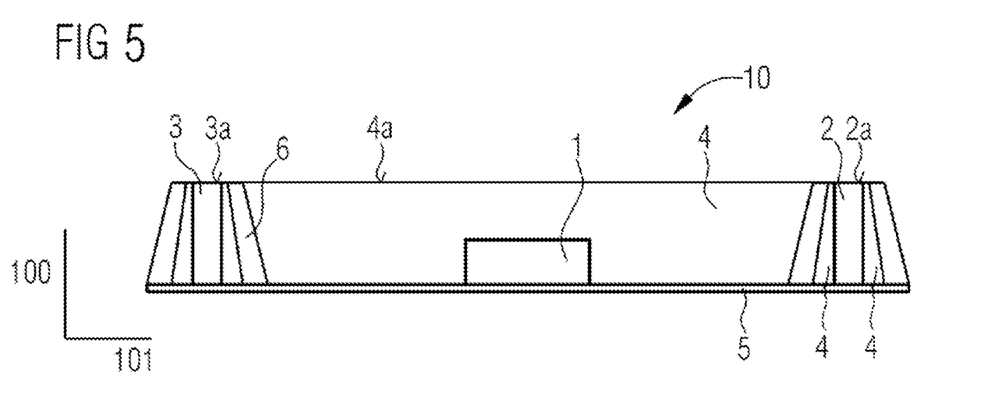
FIG. 5 shows a schematic sectional view of an exemplary embodiment of an optoelectronic device described here.

FIGS. 2 and 5 show an optoelectronic device 10 in which the at least one active element 2 and/or the at least one sensor element 3 is embedded in the reflector element 6 which laterally surrounds the radiation-emitting semiconductor chip 1 at least in places in lateral directions 101. The reflector element 6 here comprises, for example, a reflector wall which is inclined away from the at least one optoelectronic semiconductor chip and runs obliquely to the main plane of extension of the device. The reflector wall forms an acute angle with the vertical direction 100. The inner surface of the reflector wall facing the radiation-emitting semiconductor chip 1 is configured to reflect the electromagnetic radiation emitted by the radiation-emitting semiconductor chip 1. The at least one active element 2 and/or the at least one sensor element 3 is embedded, for example, on the outer surface of the reflector element 6 facing away from the radiation-emitting semiconductor chip 1. Here the reflector element 6 is arranged at least in places in lateral directions 101 between the radiation-emitting semiconductor chip 1 and the at least one active element 2 and/or the at least one sensor element 3. The at least one active element 2 and/or the at least one sensor element 3 can terminate flush with the reflector element in vertical direction 100.

Here, the radiation-emitting semiconductor chip 1 is embedded, for example, in the cover body 4, which is transmissive, for example transparent. In this case, the cover body 4 projects beyond the radiation-emitting semiconductor chip 1 in the vertical direction 100 on the emission side. The cover body 4 completely surrounds the radiation-emitting semiconductor chip 1 in lateral directions 101 and extends in lateral directions 101 up to the reflector element 6. The reflector element 6 projects beyond the cover body 4 in vertical direction 100 in the direction of the emission side. On the side facing away from the emission side, the carrier terminates flush with the embedded elements 1, 2, 3.

Figure 3:
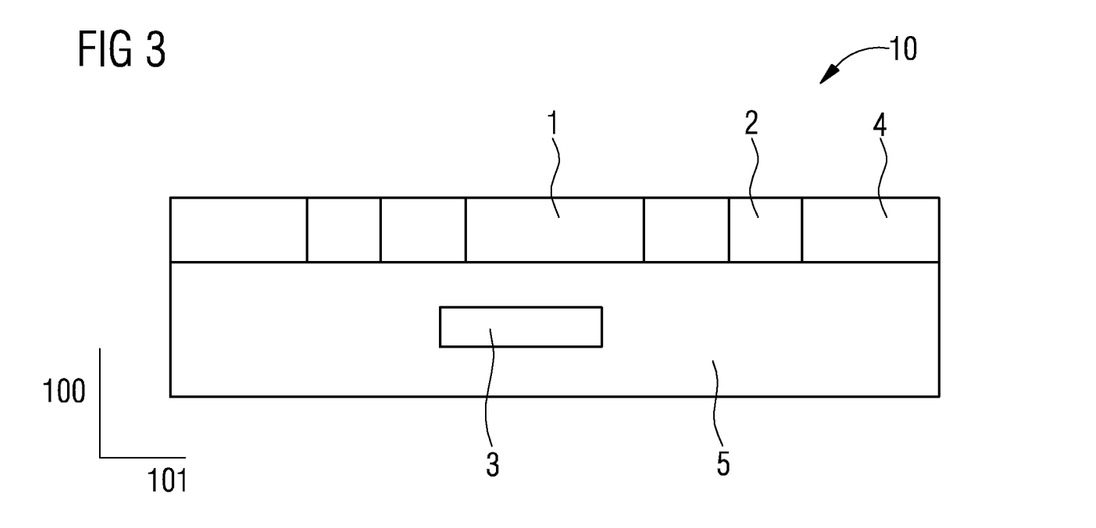

FIG. 3 shows an optoelectronic device 10 in which the radiation-emitting semiconductor chip 1 is mounted directly on the carrier 5. In this case, the carrier 5 completely surrounds the at least one sensor element 3. In plan view, the radiation-emitting semiconductor chip 1 is above the at least one sensor element 3. This arrangement is therefore particularly space-saving. The at least one active element 2 can be mounted on the carrier 5 spaced apart from the radiation-emitting semiconductor chip 1 in lateral directions 101 and embedded with the radiation-emitting semiconductor chip 1 in the cover body 4.

Figure 4:
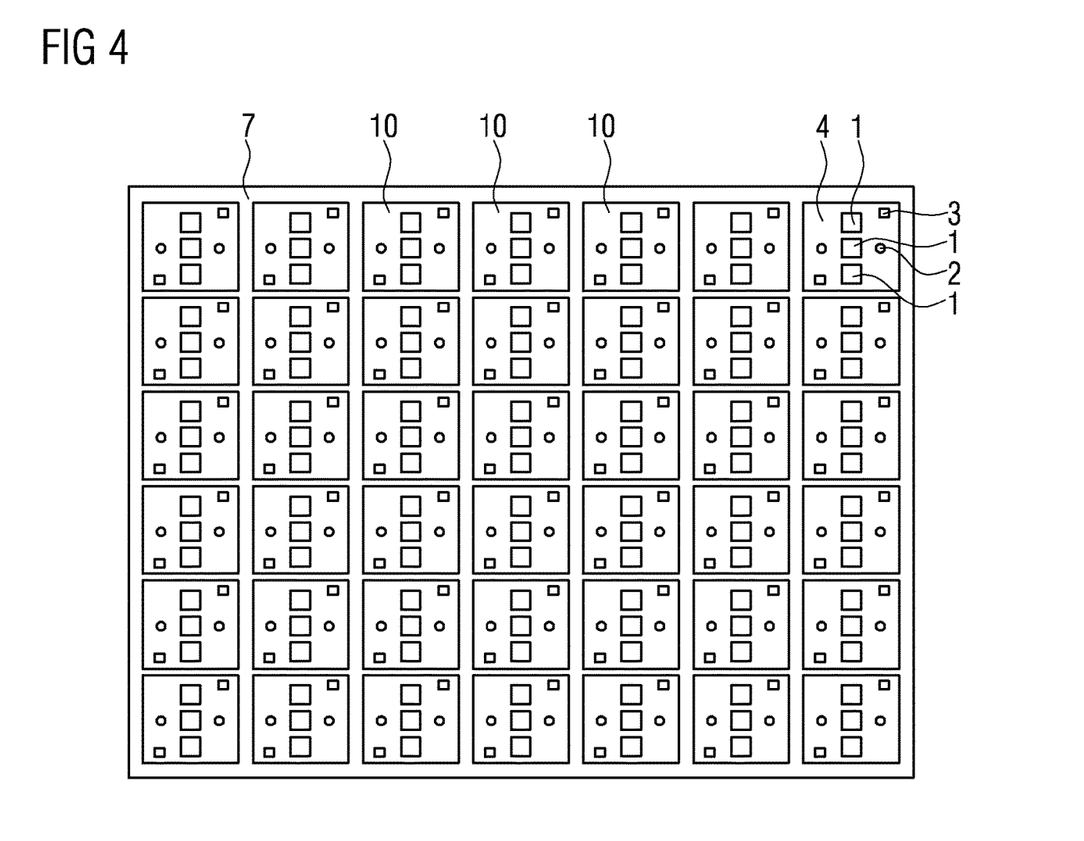
FIG. 4 shows a schematic top view of an exemplary embodiment of a display device for a plurality of optoelectronic devices described here.

FIG. 4 shows a display device with a plurality of optoelectronic devices 10, which is configured to display images or video sequences. The arrangement of the optoelectronic devices 10 is preferably arranged matrix-like, with a limiting element 7 being arranged between adjacent optoelectronic devices 10. The optoelectronic devices 10 are, for example, embedded in lateral directions 101 next to one another in a second cover body, which forms the limiting element 7. The optoelectronic devices 10 each comprise the cover body 4 in which the radiation-emitting semiconductor chips 1, the at least one active element 2 and the at least one sensor element 3 are embedded and are arranged spaced apart from one another in lateral directions 101. The radiation-emitting semiconductor chips 1 are arranged linearly. Deviating from this, an arrangement in a triangle is also possible.

Alternatively, the limiting element 7 can be formed by the reflector element 6 which laterally surrounds the radiation-emitting semiconductor chip 1 at least in places in lateral directions 101 and which is configured to reflect electromagnetic radiation generated by the radiation-emitting semiconductor chip 1 during operation. The at least one active element 2 and/or the at least one sensor element 3 is here embedded between the adjacent reflector elements 6.

The invention described here is not limited by the description based on the exemplary embodiments. Rather, the invention comprises every new feature as well as every combination of features, which in particular includes every combination of features in the claims, even if this feature or this combination itself is not explicitly stated in the claims or exemplary embodiments.

REFERENCE SIGNS LIST 1 radiation-emitting semiconductor chip
1a top surface of the radiation-emitting semiconductor chip
2 active element
2a top surface of the active element
3 sensor element
3a top surface of the sensor element
4 cover body
4a top surface of the cover body
5 carrier
5a integrated circuit
6 reflector element
7 limiting element
10 optoelectronic device
100 vertical direction
101 lateral directions

The invention claimed is:

1. Optoelectronic device, comprising:
a radiation-emitting semiconductor chip configured to generate electromagnetic radiation,
at least one active element configured to change a physical state, and
a carrier,
wherein:
the radiation-emitting semiconductor chip and the active element are arranged on the carrier,
the at least one active element is embedded in a reflector element, and the reflector element comprises a reflector wall, and wherein a respective top surface of the active element and the reflector element are coplanar,
the at least one active element is arranged spaced apart in lateral directions from the radiation-emitting semiconductor chip, and
the physical change of state comprises at least one of the following: temperature change, mechanical motion.

2. Optoelectronic device according to claim 1 with a sensor element configured to detect at least one of the following quantities:
temperature, pressure, sound, electromagnetic radiation, electrical capacitance.

3. Optoelectronic device according to claim 2, in which the sensor element is embedded in a cover body of the device.

4. Optoelectronic device according to claim 1, in which the physical change of state by the active element is haptically detectable.

5. Optoelectronic device according to claim 2, in which the sensor element and at least one of the following elements are arranged spaced apart from one another in lateral directions: the radiation-emitting semiconductor chip, or the active element.

6. Optoelectronic device according to claim 1, in which the at least one active element is further embedded in at least one of: a cover body or the carrier.

7. Optoelectronic device according to claim 1, in which the active element and the radiation-emitting semiconductor chip are embedded in a cover body.

8. Optoelectronic device according to claim 6, in which a sensor element is embedded in the cover body.

9. Optoelectronic device according to claim 6, in which the cover body terminates flush with a sensor element and/or the active element in a vertical direction or the sensor element and/or the active element project beyond the cover body.

10. Optoelectronic device according to claim 1, in which the active element is embedded in the reflector element which laterally surrounds the radiation-emitting semiconductor chip at least in places in lateral directions and which is configured to reflect electromagnetic radiation generated by the radiation-emitting semiconductor chip during operation.

11. Optoelectronic device according to claim 1, in which a sensor element is embedded in the reflector element.

12. Optoelectronic device according to claim 1, wherein at least one of the following elements is attached to the carrier and/or embedded in the carrier: the radiation-emitting semiconductor chip, the at least one active element, sensor element.

13. Optoelectronic device according to claim 12, in which the carrier comprises an integrated circuit.

14. Optoelectronic device according to claim 13, in which the integrated circuit electrically connects at least two of the following elements and/or controls at least one of the following elements: the radiation-emitting semiconductor chip, the at least one active element, the sensor element.

15. Display device with a plurality of optoelectronic devices according to claim 1, which is configured to display images or video sequences.

16. Optoelectronic device, comprising:
a radiation-emitting semiconductor chip configured to generate electromagnetic radiation,
at least one active element configured to change a physical state, and
a carrier,
wherein:
the radiation-emitting semiconductor chip and the active element are arranged on the carrier,
the at least one active element is embedded in a reflector element, and the reflector element comprises a reflector wall, wherein the reflector wall is inclined away from the radiation-emitting semiconductor chip on a first side and is inclined towards the radiation-emitting semiconductor chip on an opposing second side,
the at least one active element is arranged spaced apart in lateral directions from the radiation-emitting semiconductor chip, and
the physical change of state comprises at least one of the following: temperature change, mechanical motion.

17. Optoelectronic device according to claim 16, in which the optoelectronic device is a traffic light or a street lamp.

* * * * *